(12) United States Patent
Wang et al.

(10) Patent No.: US 11,114,642 B2
(45) Date of Patent: Sep. 7, 2021

(54) FLEXIBLE DISPLAY PANEL, FLEXIBLE DISPLAY DEVICE, AND METHOD OF FABRICATING FLEXIBLE DISPLAY PANEL

(71) Applicant: BOE TECHNOLOGY GROUP CO., LTD., Beijing (CN)

(72) Inventors: Hejin Wang, Beijing (CN); Mingche Hsieh, Beijing (CN); Shanchen Kao, Beijing (CN)

(73) Assignee: BOE TECHNOLOGY GROUP CO., LTD., Beijin (CN)

( * ) Notice: Subject to any disclaimer, the term of this patent is extended or adjusted under 35 U.S.C. 154(b) by 422 days.

(21) Appl. No.: 16/332,539

(22) PCT Filed: Oct. 10, 2018

(86) PCT No.: PCT/CN2018/109621
§ 371 (c)(1),
(2) Date: Mar. 12, 2019

(87) PCT Pub. No.: WO2019/214156
PCT Pub. Date: Nov. 14, 2019

(65) Prior Publication Data
US 2021/0217995 A1    Jul. 15, 2021

(30) Foreign Application Priority Data
May 7, 2018  (CN) .......................... 201810426360.6

(51) Int. Cl.
*H01L 51/52*   (2006.01)
*H01L 27/32*   (2006.01)
(Continued)

(52) U.S. Cl.
CPC ........ *H01L 51/5275* (2013.01); *H01L 27/322* (2013.01); *H01L 27/3244* (2013.01);
(Continued)

(58) Field of Classification Search
None
See application file for complete search history.

(56) References Cited

U.S. PATENT DOCUMENTS 9,036,259 B2    5/2015  Wu et al.
9,368,757 B2 *  6/2016  Choi ................... H01L 51/5284
(Continued)

FOREIGN PATENT DOCUMENTS

CN    102854625 A    1/2013
CN    105390528 A    3/2016
(Continued)

OTHER PUBLICATIONS

Search Report and Written Opinion, dated Jan. 30, 2019, issued in counterpart International Application No. PCT/CN2018/109621 (12 pages; in English).
(Continued)

*Primary Examiner* — Dung A. Le
(74) *Attorney, Agent, or Firm* — Westerman, Hattori, Daniels and Adrian, LLP

(57) ABSTRACT

The present disclosure generally relates to display technology. A flexible display panel may include a flexible substrate; a display layer on the flexible substrate; and a lens layer and a color filter on the display layer. The display layer may include a plurality of light-emitting units. The color filter layer may include a black matrix that defines a plurality of filter units, each filter unit corresponding to one of the plurality of light-emitting units. The lens layer may include at least one lens that corresponds to at least one of the plurality of filter units, and that is configured to magnify light emitted by a light-emitting unit into a magnified light spot, and project the magnified light spot onto a filter unit corresponding to the light-emitting unit, the magnified light spot having an area larger than a surface area of the corresponding filter unit in a non-stretched state.

19 Claims, 15 Drawing Sheets

(51) Int. Cl.
*H01L 51/00* (2006.01)
*H01L 51/56* (2006.01)
*G02B 3/08* (2006.01)

(52) U.S. Cl.
CPC ...... *H01L 51/0097* (2013.01); *H01L 51/5284* (2013.01); *H01L 51/56* (2013.01); *G02B 3/08* (2013.01); *H01L 2227/323* (2013.01); *H01L 2251/5338* (2013.01)

(56) References Cited

U.S. PATENT DOCUMENTS

| | | | |
|---|---|---|---|
| 10,644,083 B2* | 5/2020 | Lee | H01L 51/5256 |
| 2005/0145867 A1* | 7/2005 | Yau | H01L 33/58 257/98 |
| 2011/0062476 A1 | 3/2011 | Tobise | |
| 2014/0339509 A1 | 11/2014 | Choi et al. | |
| 2015/0084026 A1* | 3/2015 | Miyamoto | H01L 27/3241 257/40 |

FOREIGN PATENT DOCUMENTS

| | | |
|---|---|---|
| CN | 106773314 A | 5/2017 |
| CN | 108598125 A | 9/2018 |

OTHER PUBLICATIONS

Office Action dated Mar. 27, 2019, issued in counterpart Chinese application No. 201810426360.6 (w/ English machine translation; 10 pages).

* cited by examiner

FLEXIBLE DISPLAY PANEL, FLEXIBLE DISPLAY DEVICE, AND METHOD OF FABRICATING FLEXIBLE DISPLAY PANEL

CROSS-REFERENCE TO RELATED APPLICATIONS

This application claims benefit of the filing date of Chinese Patent Application No. 201810426360.6 filed on May 7, 2018, the disclosure of which is hereby incorporated in its entirety by reference.

TECHNICAL FIELD

The present disclosure generally relates to display technology, and in particular to flexible display technology, including flexible display panel, display device containing flexible display panel, and method of fabricating flexible display panel.

BACKGROUND

Advances are continuously being made in the fields of display technology, and with every advance made, users raise their demands and expectations for a display device's appearance and functionalities. Flexible displays have many advantages such as stretchability, deformability, low power consumption, light weight, thinness, and so on, and as such, flexible displays have garnered tremendous attention and have become a main development prospect.

BRIEF SUMMARY

An embodiment of the present disclosure is a flexible display panel. The flexible display panel may comprise a flexible substrate; a display layer on the flexible substrate; and a lens layer and a color filter on the display layer. The display layer may comprise a plurality of light-emitting units. The color filter layer may comprise a black matrix that defines a plurality of filter units, each filter unit corresponding to one of the plurality of light-emitting units. The lens layer and the color filter layer may be on a light-emitting side of the display layer. The lens layer may comprise at least one lens, the at least one lens corresponding to at least one of the plurality of filter units. The at least one lens may be configured to magnify light emitted by a light-emitting unit into a magnified light spot, and project the magnified light spot onto a filter unit corresponding to the light-emitting unit, the magnified light spot having an area larger than a surface area of the corresponding filter unit in a non-stretched state.

In at least some embodiments, the light-emitting side of the display layer may be on a side of the display layer opposite from the flexible substrate, and the lens layer is between the display layer and the color filter layer.

In at least some embodiments, the light-emitting side of the display layer may be on a side of the display layer closer to the flexible substrate, and the lens layer and the color filter layer are on a side of the flexible substrate opposite from the display player.

In at least some embodiments, the at least one lens may be a convex lens.

In at least some embodiments, the at least one lens may be a Fresnel lens.

In at least some embodiments, a plane of the at least one lens may be on a side of the lens layer closer to the display layer, and a convex portion of the at least one lens is convex along a direction in which the light is emitted.

In at least some embodiments, an entirety of each of the plurality of light-emitting units may be located within a focal length of the at least one lens.

In at least some embodiments, an entirety of a light-emitting region of each of the plurality of light-emitting units may be located within a focal length of the at least one lens.

In at least some embodiments, the flexible substrate may comprise a plurality of substrate regions and a plurality of connecting portions connecting adjacent substrate regions.

In at least some embodiments, the plurality of light-emitting units may form islands on the plurality of substrate regions.

In at least some embodiments, the plurality of connecting portions may be deformable.

In at least some embodiments, the flexible display panel may comprise a plurality of light-emitting regions and a plurality of non-light-emitting regions. A ratio of a total area of the plurality of light-emitting regions to a total area of the plurality of non-light-emitting regions may remain substantially the same when the flexible display panel is in a stretched state or in the non-stretched state.

In at least some embodiments, the flexible display panel may further comprise a thin film transistor array layer between the display layer and the flexible substrate.

In at least some embodiments, the flexible display panel may further comprise an encapsulation structure on the light-emitting side of the display layer.

Another embodiment of the present disclosure is a display device. The display device may comprise a flexible display panel as described above.

Another embodiment of the present disclosure is a method of fabricating a flexible display panel. The method may comprise forming the flexible substrate; forming the display layer on one side of the flexible substrate; forming the lens layer on the light-emitting side of the display layer; and forming the color filter layer on a light-emitting side of the lens layer.

In at least some embodiments, the method may further comprise, before the forming of the display layer, forming a thin film transistor array layer on the flexible substrate. The display layer may be formed on a side of the thin film transistor array layer opposite from the flexible substrate.

In at least some embodiments, the method may further comprise forming an encapsulation structure on the thin film transistor array layer.

In at least some embodiments, the lens layer may comprise at least one Fresnel lens, and the forming of the lens layer may comprise forming a first transparent layer on the light-emitting side of the display layer to form a lens substrate; forming a light-shielding layer on the lens substrate; and patterning the light-shielding layer to form a patterned surface comprising a plurality of concentric circles, the lens substrate and the patterned surface forming the Fresnel lens.

In at least some embodiments, the forming of the lens layer may further comprise forming a second transparent layer on the patterned surface to form a protective layer.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
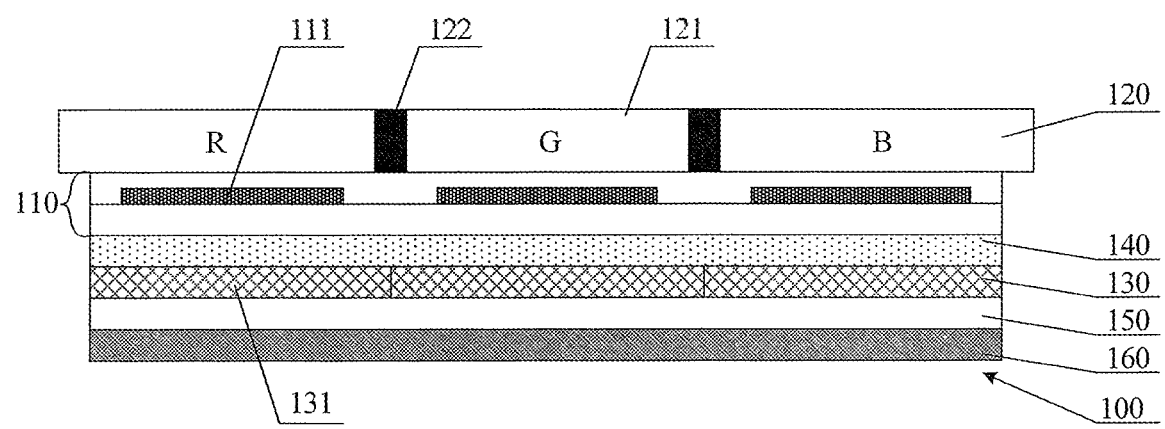
FIG. 1 shows a schematic diagram of a flexible display panel according to an embodiment of the present disclosure.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

A numerical range modified by "approximately" herein means that the upper and lower limits of the numerical range can vary by 10% thereof. A number modified by "approximately" herein means that the number can vary by 10% thereof.

Advances are continuously being made in the fields of display technology, and with every advance made, users raise their demands and expectations for a display device's appearance and functionalities. Flexible displays have many advantages such as stretchability, deformability, low power consumption, light weight, thinness, and so on, and as such, flexible displays have garnered tremendous attention and have become a main development prospect.

The designs and constructions of conventional stretchable flexible displays are based on the principles underlying coplanar light-emitting pixel display technology. When such a conventional flexible display panel is stretched, distances between pixels invariably increase. Spaces between pixels are non-light-emitting, so that when distances between pixels increase, the total surface area of non-light-emitting regions (the "openings") on the display panel is also increased, and the ratio of light-emitting regions to non-light-emitting regions decreases. This can cause a significant, post-stretching decrease in the display brightness of the flexible display panel. However, there is a degree of randomness in the stretching of the flexible display panel, that is, the flexible display panel may not be uniformly stretched. It can therefore be difficult to determine how stretching deforms the flexible display panel. This can produce irregularly sized openings on the stretched flexible display panel, which can in turn cause unevenness in the display brightness.

The present disclosure relates generally to a flexible display panel, a display device containing a flexible display panel, and a method of fabricating a flexible display panel. In an embodiment of the present disclosure, the display panel includes a flexible substrate; a display layer on one side of the flexible substrate, which display layer includes a plurality of light-emitting units; and a lens layer and a color filter layer arranged on a light-emitting side of the display layer. The color filter layer includes a black matrix and a plurality of filter units. Each filter unit corresponds to a light-emitting unit, and is defined by the black matrix. The surface area of a color filter unit increases when the filter unit is in a stretched state. The lens layer includes at least one lens provided between a light-emitting unit and the corresponding filter unit. The at least one lens is configured so that light emitted by the light-emitting unit, and that passes through the lens, forms a magnified light spot on the surface of the color filter layer facing the light-emitting unit. The area of the magnified light spot is larger than the surface area of the filter unit in a non-stretched state. The present disclosure makes it possible to increase the total area of the light-emitting regions on the flexible display panel when stretched, so that stretching is less likely to reduce display brightness and/or the evenness of the display brightness.

In the present disclosure, "stretching" may refer to linear stretching or non-linear stretching. In linear stretching, the flexible display panel may be substantially uniformly stretched. In non-linear stretching, the flexible display panel is not uniformly stretched, and there may be portions of the flexible display panel that does not experience any stretching, and even within portions of the flexible display panel that does experience stretching, different positions may be subject to different amount of stretching force.

FIG. 1 shows a schematic diagram of a flexible display panel according to an embodiment of the present disclosure. The flexible display panel 100 includes a flexible substrate 160, a display layer 130, a color filter 120, and a lens layer 110.

The flexible substrate 160 may be composed of polyimide. However, the composition of the flexible substrate and the method of forming the flexible substrate are not particularly limited. The flexible substrate may be formed by any appropriate means known to a person of ordinary skill in the art, so long as the substrate is formed with flexibility.

The display layer 130 is provided on one side of the flexible substrate 160, and includes a plurality of light-emitting units 131. In some embodiments, the light-emitting units 131 may be configured to emit white light, so that the display layer 130 may be correspondingly configured to emit white light.

The color filter layer 120 is provided on a light-emitting side of the display layer 130. More particularly, the color filter layer 120 may be provided on a side of the display layer opposite from the substrate 160. The color filter layer 120 includes a black matrix 122 and a plurality of filter units 121. Each filter unit 121 is defined by the black matrix 122. Each filter unit 121 corresponds to a light-emitting unit 131. The surface area of a filter unit 121, as measured using the surface of the filter unit 121 opposite from the flexible substrate 160, increases when the filter unit 121 is in a stretched state.

The lens layer 110 is between the display layer 130 and the color filter layer 120. More particularly, the lens layer 110 is provided on a light-emitting side of the display layer 130. The lens layer 110 includes at least one lens, which is provided between a light-emitting unit 131 and the filter unit 121 corresponding to the light-emitting unit 131. The lens 111 is configured so that light emitted by the light-emitting unit 131 passes through the lens 111 and forms a magnified light spot on the surface of the color filter layer 120 facing the light-emitting unit 131. The area of the magnified light spot is larger than the surface area of the filter unit 121 in the non-stretched state.

The lens 111 may be a convex lens, so that based on the principles of optics, an image of an object is magnified when the distance between the object and the convex lens is smaller than the focal length. In some embodiments, the lens 111 is a Fresnel lens. The plane of the lens 111 is on a side of the lens layer closer to the light-emitting side of the display layer 130, and the convex portion of the lens 111 is convex in the direction in which the light is emitted. Light passing through the convex lens 111 becomes magnified. More particularly, in a flexible display panel according to the present disclosure, when a light-emitting unit 131 is provided with a corresponding lens 111 on its light-emitting side, the light-emitting unit 131 is positioned within the focal length of the corresponding lens 111. A light-emitting unit 131 comprises a plurality of light-emitting regions. The light-emitting regions of the light-emitting units 131 are located within the focal length of the lens 111. When the light-emitting unit 131 and the lens 111 are so configured, light emitted by the light-emitting unit 131 passes through the lens 111, and according to the principles of optics, forms a magnified light spot on the color filter layer 120 facing the light-emitting unit 131.

Light passing through the lens layer 110 exhibits reduced divergence as compared to the light originally emitted by the light-emitting units 131. In some embodiments where the light-emitting units 131 are configured to emit white light, the light passing through the lens layer 110 remains a white light. The color filter layer 120 on the light-emitting side of the lens layer 110 converts the white light into colored lights. The color filter layer 120 comprises a plurality of filter units 121. The filter units 121 may comprise a red filter unit (R), a green filter unit (G), and a blue filter unit (B). When white light passes through the filter units 121 of the color filter layer 120, the white light becomes a red, green, or blue monochromatic light, and realizes the display functions of the flexible display panel. To avoid color washout due to interference from adjacent filter units 121 of different colors, a black matrix 122 is provided with adjacent filter units 121 to separate the adjacent filter units 121, for example, as shown in FIG. 1.

Figure 2:
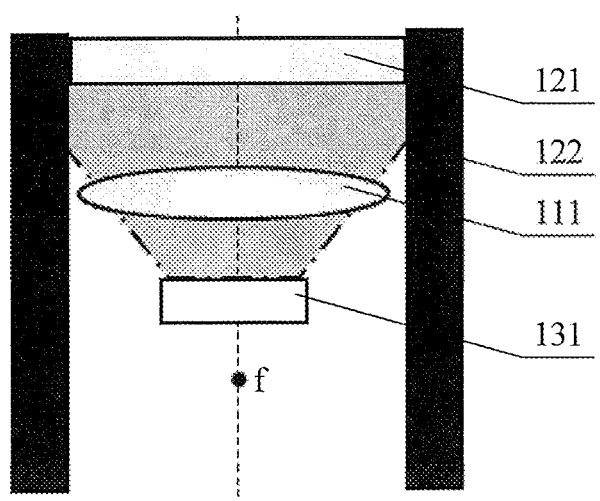
FIG. 2 shows a schematic diagram of a flexible display panel, in a non-stretched state, according to an embodiment of the present disclosure.
Figure 3:
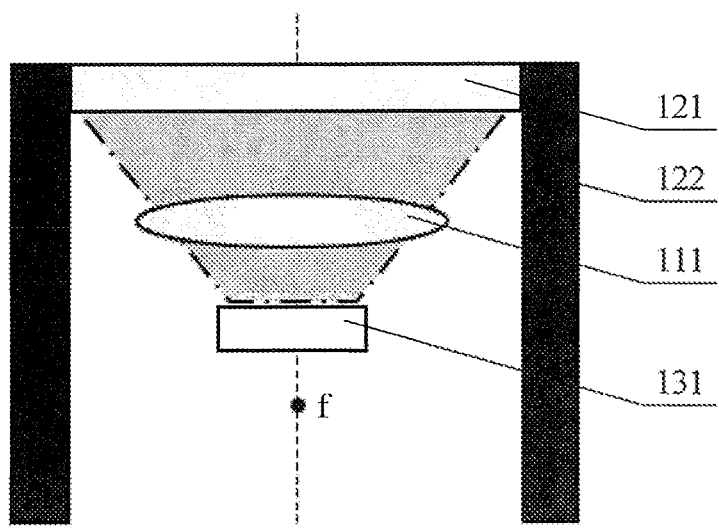
FIG. 3 shows a schematic diagram of the flexible display panel in FIG. 2, in a stretched state.

FIG. 2 shows a schematic diagram of a flexible display panel, in a non-stretched state, according to an embodiment of the present disclosure. FIG. 3 shows a schematic diagram of the flexible display panel in FIG. 2, in a stretched state. As shown in FIGS. 2 and 3, the flexible display panel 100 includes a flexible substrate 160. The other components of the flexible display panel 100 are provided on the flexible substrate 160, so as to be imparted with flexible stretchability. A flexible display panel according to the present invention has remarkable usability when incorporated in a display device.

The color filter layer 120 is composed of a polymer material, and in particular a polymer material having stretchability. The polymer material forming the color filter layer 120 may be any polymer material known to a person of ordinary skill in the art, and is not particularly limited, so long as the polymer material has stretchability. When the flexible display panel 100 is stretched, the polymer material forming the color filter layer 120 allows the color filter layer 120 to deform in a corresponding manner to the flexible display panel 100, that is, the color filter 120 may also be stretched, which may be observed as an increase in the distance between adjacent black matrix 122. When the flexible display panel is in a stretched state, the surface area of the filter units 121 as defined by the black matrix 122 is increased. In other words, the surface area of a filter unit 121 increases when the filter unit 121 is in a stretched state. The filter unit 121 is configured so that its surface area may increase when the filter unit 121 is in a stretched state, but the surface area of the filter unit 121 is not necessarily increased whenever the filter unit 121 is stretched. Rather, the filter unit 121 must be stretched past a certain threshold before the surface area of the filter unit 121 is affected.

In a flexible display panel according to the present disclosure, when a light-emitting unit 131 is provided with a corresponding lens 111 on its light-emitting side, the light-emitting unit 131 is positioned within the focal length of the corresponding lens 111. The light-emitting regions of the light-emitting unit 131 are located within the focal length of the lens 111. Light emitted by the light-emitting unit 131 passes through the lens 111 and is diffused. Each light-emitting unit 131 corresponds to a filter unit 121. When the filter unit 121 is in a non-stretched state, the surface area of the filter unit 121, as defined by the black matrix 122, is smaller than the area of the light spot formed by the light passing through the lens 111. As a result, from the perspective of the light-emitting unit 131 provided with the lens 111 on its light-emitting side, the black matrix 122 in a flexible display panel 100 in the non-stretched state blocks a portion of the light emitted by the light-emitting unit 131. This is shown in FIG. 2. More particularly, as shown in FIG. 2, the lens 111 has a focal length f. The light-emitting region of the light-emitting unit 131 is located entirely within the focal length f of the lens 111. Light emitted by the light-emitting unit 131 passes through the lens and becomes diffused. However, portions of the light projected onto the filter unit 121 is blocked by the black matrix 122 (in FIG. 2, the leftmost and rightmost portions of the light are truncated by the black matrix 122). In other words, as shown in FIG. 2, the light spot formed by the light emitted by the light-emitting unit 131 and that passes through the lens 111 has an area that is larger than the surface area of the filter unit 121 in the non-stretched state.

On the other hand, as shown in FIG. 3, when the flexible display panel 100 is in the stretched state, the surface area of the filter unit 121 defined by the black matrix 122 increases, so that light initially blocked by the black matrix 122 when the flexible display panel 100 was in the non-stretched state is now projected onto the filter unit 121 with the increased surface area. In other words, the light-emitting surface of the flexible display panel 100 is effectively increased. The light spot formed by light emitted by the light-emitting unit 131 and that passes through the lens 111 has an area that is larger than the surface area of the filter unit 121 in the non-stretched state. The surface area of the filter unit 121 in the non-stretched state refers to the surface area of the filter unit 121 when the filter unit 121 has not undergone any deformations.

The number and position of the lens 111 are not particularly limited. For example, in some embodiments, the flexible display panel may comprise a single lens 111, and the single lens 111 is located at a position on the flexible display panel most likely to be subject to stretching. In some embodiments, the flexible display panel may comprise a plurality of lenses 111. The flexible display panel may comprise the same number of light-emitting units 131 and lenses 111, or the flexible display panel may comprise fewer lenses 111 than the light-emitting units 131. The lenses may be located at positions on the flexible display panel most likely to be subject to stretching. The lenses 111 may be arranged in a distributed manner, or in a centralized manner.

In some embodiments, the flexible display panel may include an encapsulation structure 140 on a light-emitting side of the display layer 130. The encapsulation structure 140 comprises a thin encapsulation film. The materials for forming the thin encapsulation film are not particularly limited, and may be any appropriate material know to a person of ordinary skill in the art to be moisture-impermeable and/or oxygen-impermeable. The encapsulation structure 140 is a structure for encapsulating components inside the flexible display panel, and functions to prevent moisture and oxygen from damaging the encapsulated components. In some embodiments, the components that may be encapsulated in the encapsulation structure 140 include a hole transfer layer, an emitting layer, and an electron transfer layer. The components that may be encapsulated in the encapsulation structure are not particularly limited, and may be any components known to a person of ordinary skill in the art to require protection from damages by moisture and/or oxygen.

In some embodiments, the flexible display panel may include a thin film transistor (TFT) array layer 150 between the display layer 130 and the flexible substrate 160. The TFT array layer comprises a plurality of TFTs connected by metal wiring.

In conventional flexible display panels, the total area of the light-emitting regions of the display panel is fixed. When the display panel is stretched, the space between adjacent pixels is increased, and the ratio of "openings" corresponding to the ratio of the total area of light-emitting regions to the total area of non-light emitting regions is reduced. For example, if the display panel is stretched in a linear bi-axial manner (for instance, along the x-y axes), the ratio of the openings after the stretching may be determined according to the formula:

$$A = \frac{B}{(1 + \text{elongation ratio})^2}$$

Figure 4:
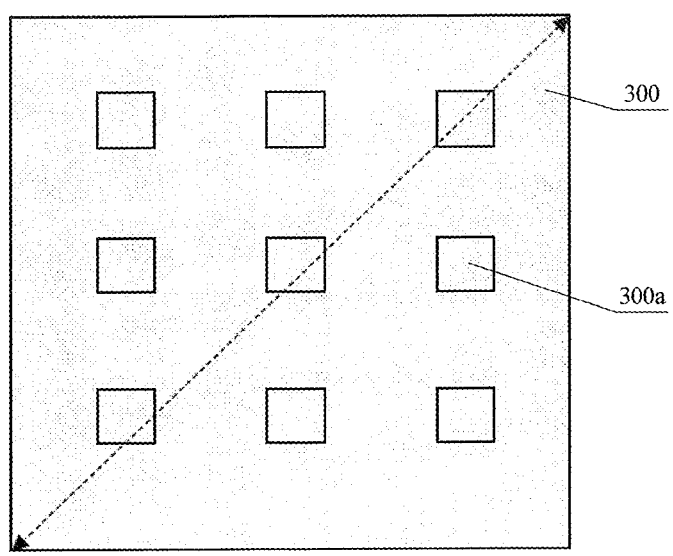
FIG. 4 shows a schematic diagram illustrating the openings on a conventional flexible display panel, in a non-stretched state.
Figure 5:
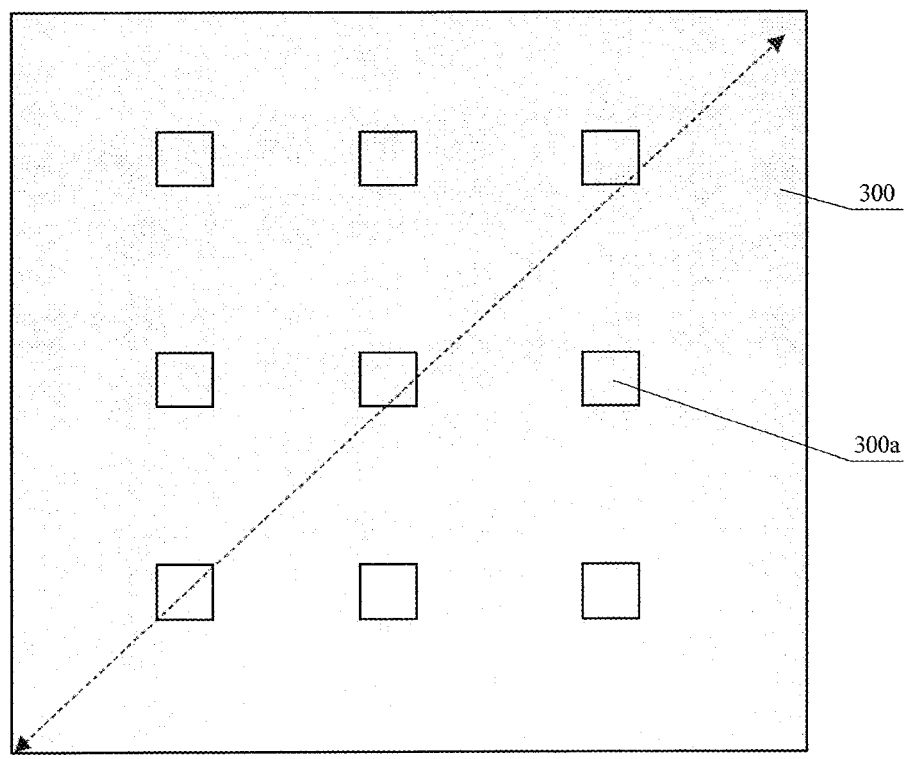
FIG. 5 shows a schematic diagram illustrating the openings on the conventional flexible display panel in FIG. 4, in a stretched state.

A represents the ratio of openings post-stretching. B represents the ratio of openings pre-stretching, and may be in the range of, for example, 30-60%. Elongation ratio is usually in the range of from 2 to 100%. As an illustrative example, if A is 30%, and the elongation ratio along the x-y axes is 10%, then B would be reduced to 24.7%. FIG. 4 shows a schematic diagram illustrating the openings on a conventional flexible display panel, in a non-stretched state. FIG. 5 shows a schematic diagram illustrating the openings on the conventional flexible display panel in FIG. 4, in a stretched state. Comparing FIG. 5 to FIG. 4 shows that the surface area of the flexible display panel 300 increases when stretched, but the total area of the light-emitting regions 300a remains the same, while the total area of the non-light-emitting regions has increased. The ratio of "openings" corresponding to the ratio of the total area of the light-emitting regions to the total area of the non-light-emitting regions is smaller, which can in turn lowers the display brightness of the flexible display panel.

Figure 6:
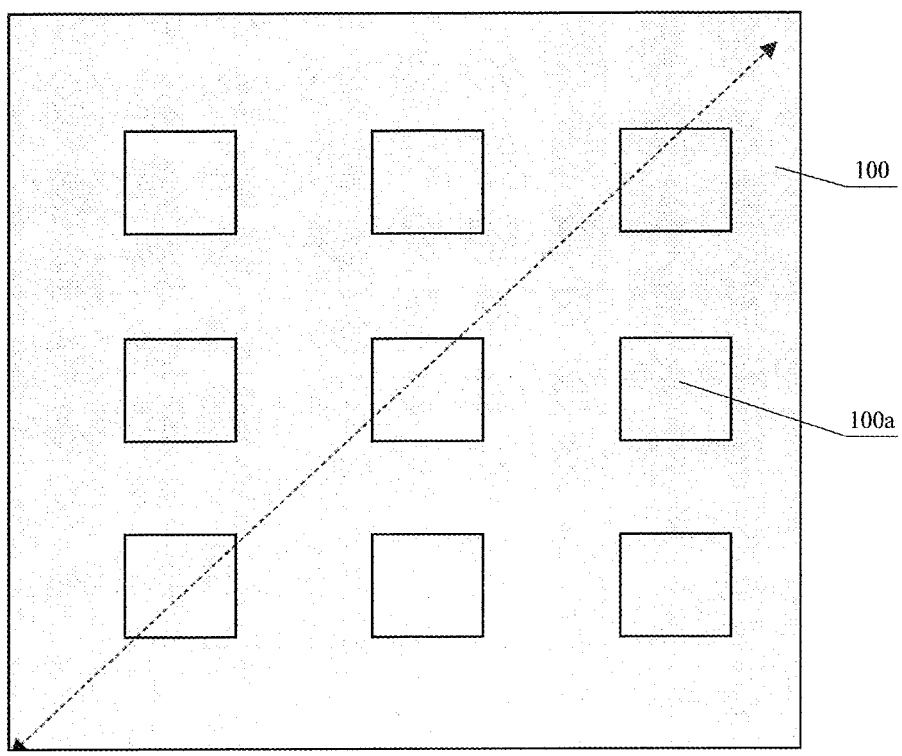
FIG. 6 shows a schematic diagram illustrating the openings on a flexible display panel, in a stretched state, according to an embodiment of the present disclosure.

FIG. 6 shows a schematic diagram illustrating the openings on a flexible display panel, in a stretched state, according to an embodiment of the present disclosure. Comparing FIG. 6 to FIGS. 4 and 5 show that in a flexible display panel according to the present disclosure, when the surface area of the flexible display panel 100 increases due to stretching, the total area of the light-emitting regions 100a also correspondingly increases. Light emitted by the light-emitting unit 131 of the display layer 130 passes through the lens 111, and forms a magnified light spot on a surface of the color filter layer 120 facing the light-emitting unit 131. In the display panel according to the present disclosure, the ratio of "openings" corresponding to the ratio of the total area of the light-emitting regions to the total area of the non-light-emitting regions therefore remains substantially unchanged despite stretching, and the brightness of the display on the flexible display panel does not noticeably suffer as a result of stretching.

There is a degree of randomness in the stretching of a flexible display panel, so that it may be difficult to determine how the flexible display panel is deformed when stretched, and the flexible display panel may not be uniformly stretched. As a result, a situation may arise where stretching reduces the ratio of "openings" corresponding to the ratio of the total area of the light-emitting regions to the total area of the non-light-emitting regions in some portions of the flexible display panel that are stretched, while the ratio remains the same in other portions of the flexible display panel that are not stretched. Not only can this cause a noticeable drop in the display brightness in those portions of the flexible display panel that are stretched, but because there are also portions of the flexible display panel that are unaffected by stretching, the display brightness becomes uneven across the flexible display panel.

In the flexible display panel according to the present disclosure, portions of the color filter layer 120 deform according to the corresponding portions of the flexible display panel 100 that am stretched. Portions of the color filter layer 120 that correspond to portions of the flexible display panel 100 that are not stretched remain substantially unchanged. In portions of the color filter layer 120 corresponding to stretched portions of the flexible display panel 100, the surface area of the filter unit 121 as defined by the black matrix 122 increases. Light emitted by the light-emitting unit 131 passes through the lens 111 and forms a magnified light spot on the surface of the color filter layer 120 facing the light-emitting unit 121. Since the surface area of the filter unit 121 has increased, the total area of light-emitting area on the flexible display panel 100 also increases. The structure and deformability of the color filter layer 120 allows the ratio of the "openings" to be maintained, because even though light passing through the lens 111 forms a magnified light spot on the color filter layer 120, only the surface area of the filter unit 121 in those portions of the color filter layer 120 corresponding to stretched portions of the flexible display panel 100 is increased. Since the ratio of "openings" corresponding to the ratio of the total area of the light-emitting regions to the total area of the non-light-emitting regions is maintained, the brightness of the display on the flexible display panel can also stay even and uniform.

The flexible display panel according to the present disclosure includes a flexible substrate 160; a display layer 130 that is on one side of the flexible substrate 160 and that includes a plurality of light-emitting units 131; and a lens layer 110 and a color filter layer 120 on the display layer 130. The color filter layer 120 includes a black matrix 122, and a plurality of filter units 121 that an defined by the black matrix 122. Each of the plurality of filter units 121 corresponds to a light-emitting unit 131. The surface area of a filter unit 121 increases when the filter unit 121 is in the stretched state. The lens layer 110 includes at least one lens 111, which is provided between at least one of the light-emitting units 131 and the filter unit corresponding to the at least one of the light-emitting units 131. Light is emitted by the light-emitting unit 131 and passes through the lens 111. Light that passes through the lens 111 forms a magnified light spot on the surface of the color filter layer 120 facing the light-emitting unit 131. The area of the magnified light spot is larger than the surface area of the filter unit 121 in the non-stretched state. The present disclosure makes it possible to increase the total area of the light-emitting regions on the flexible display panel when stretched, so that stretching is less likely to reduce display brightness and/or the evenness of the display brightness.

The lens 111 may be a convex lens, so that based on the principles of optics, an image of an object is magnified when the distance between the object and the convex lens is smaller than the focal length. The plane of the lens 111 is closer to the light-emitting side of the display layer 130, and the convex portion of the lens 111 is convex in the direction in which the light is emitted.

Convex lenses are generally thicker than concave lenses, so that when incorporated into a flexible display panel, a convex lens may increase the thickness of the assembly. This may render the flexible display panel unsuitable for use in devices that demand thinness. In some embodiments, the lens 111 in the lens layer 110 may therefore be a Fresnel lens 111. A Fresnel lens can be made much thinner than a conventional lens, and in some cases, a Fresnel lens may even take the form of a flat sheet. A Fresnel lens 111 includes a lens substrate and a pattern of concentric circles, formed by concentric ridges, on a side of the lens substrate opposite from the display layer 130. The Fresnel lens 11 may also include a protective layer on a side of the pattern of concentric circles opposite from the display layer 130.

Figure 7:
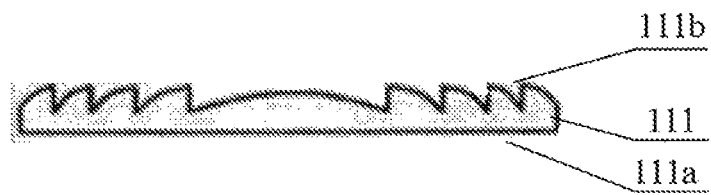
FIG. 7 shows a schematic diagram of Fresnel lens in a flexible display panel according to an embodiment of the present disclosure.
Figure 8A:
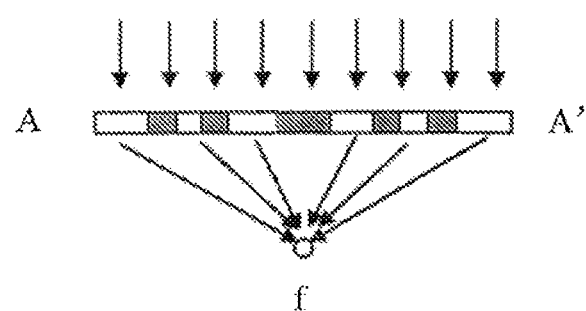
FIGS. 8A and 8B show schematic diagrams illustrating the principles of operation of the Fresnel lens in FIG. 7.
Figure 8B:
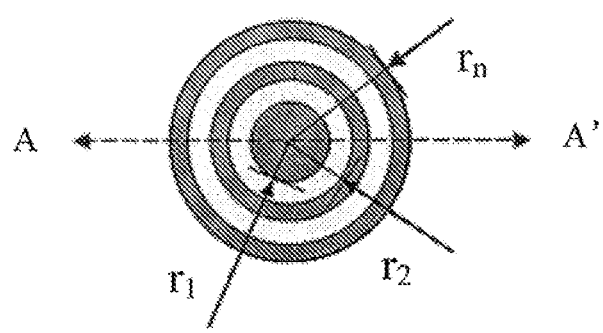

FIG. 7 shows a schematic diagram of Fresnel lens in a flexible display panel according to an embodiment of the present disclosure. FIGS. 8A and 8B show schematic diagrams illustrating the principles of operation of the Fresnel lens in FIG. 7. FIG. 7 shows a cross-sectional schematic view of a Fresnel lens. FIG. 8A shows a schematic view of a Fresnel lens from the top. FIG. 8B shows a top schematic view of the surface of a Fresnel lens.

As shown in FIG. 7, one surface 111a of the Fresnel lens is flat. The flat surface 111a is arranged to be closer to the light-emitting side of the display layer 130. The other surface 111b of the Fresnel lens contains a pattern of concentric circles, formed by concentric ridges. The patterned surface 111b is oriented to be in the direction in which light is emitted. The contours on the patterned surface 111b of the Fresnel lens act as individual refracting surfaces, bending parallel rays of incident light on the Fresnel lens to a common focal point. For example, as shown in FIG. 8A, parallel rays of incident light on the patterned surface of the Fresnel lens converge to a common focal point on the side of the flat surface. Conversely, the contours on the patterned surface 111b of the Fresnel lens also allow it to easily collimate a point light source, by placing the Fresnel lens one focal length away from the source.

The focal length of a Fresnel lens is determined according to the following equation (1):

$$f = \frac{r_n^2}{n\lambda}; \qquad (1)$$

In equation (1), "f" represents the focal point of each concentric circle. The variable "r" represents the radius of the $n^{th}$ concentric circle. The variable "λ" represents the light wavelength of concern. Based on equation (1) the radius of each concentric circle of the Fresnel lens may be calculated for a given focal length, for example, as shown in FIG. 8B.

As described above, the Fresnel lens 111 includes a lens substrate and a pattern of concentric circles, formed by concentric ridges, on a side of the lens substrate opposite from the display layer 130. The Fresnel lens 11 may also include a protective layer on a side of the pattern of concentric circles opposite from the display layer 130. The lens substrate and the protective layer may be composed of polydimethylsiloxane (PDMS). The concentric ridges may be formed using carbon nanotube (CNT). PDMS and CNT are materials with unique flexibility. The use of PDMS and CNT in forming the Fresnel lens may allow the lens to stretch correspondingly with the flexible display panel.

Figure 9:
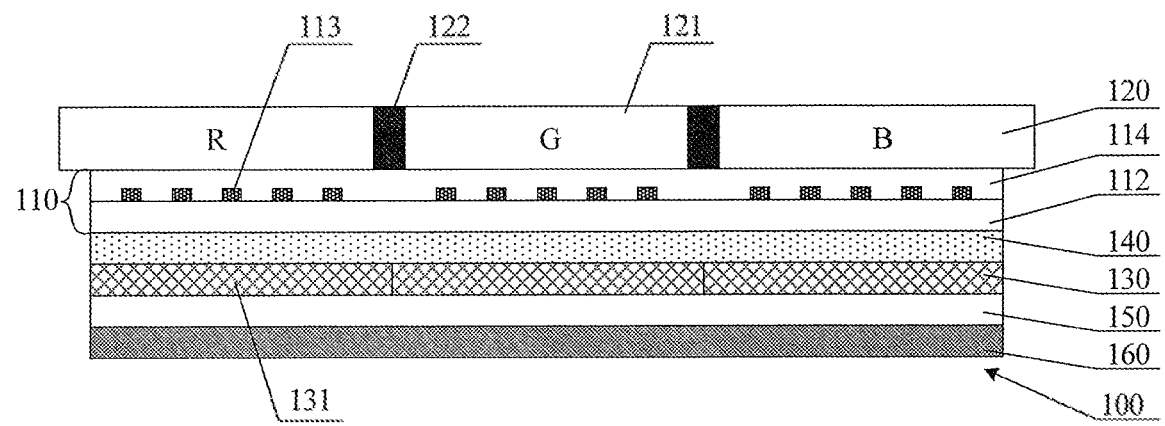
FIG. 9 shows a schematic diagram of a flexible display panel according to another embodiment of the present disclosure.

FIG. 9 shows a schematic diagram of a flexible display panel according to another embodiment of the present disclosure. In the embodiment illustrated in FIG. 9, the flexible display panel includes a Fresnel lens described above. As shown in FIG. 9, the flexible display panel comprises a flexible substrate 160, a display layer 130, a lens layer 110, and a color filter layer 120. The flexible substrate 160, the display layer 130, and the color filter layer 120 may be as described above.

The lens layer 110 comprises at least one Fresnel lens. As shown in FIG. 9, the Fresnel lens comprises a lens substrate 112, a patterned surface 113 comprising a plurality of concentric circles formed by a plurality of concentric ridges, and a protective layer 114 on a light-emitting side of the patterned surface 113. In embodiments where the lens layer 110 comprises a plurality of Fresnel lenses, the plurality of Fresnel lenses may share a common lens substrate 112. For example, the lens substrate 112 of the plurality of Fresnel lenses may be formed as a unitary structure.

The lens substrate 112 and the protective layer 114 may each comprise a transparent polymer layer. In some embodiments, the lens substrate 112 and the protective layer 114 may be composed of polydimethylsiloxane (PDMS). The patterned surface 113 may be provided on a light-emitting side of the lens substrate 112. The concentric ridges of the patterned surface 113 may be formed using carbon nanotube (CNT). The protective layer 114 may be provided on a light-emitting side of the patterned surface 113. Both the lens substrate 112 and the protective layer 114 may function to protect the patterned surface 113. The lens substrate 112 may also function to adjust the focal length.

Figure 10:
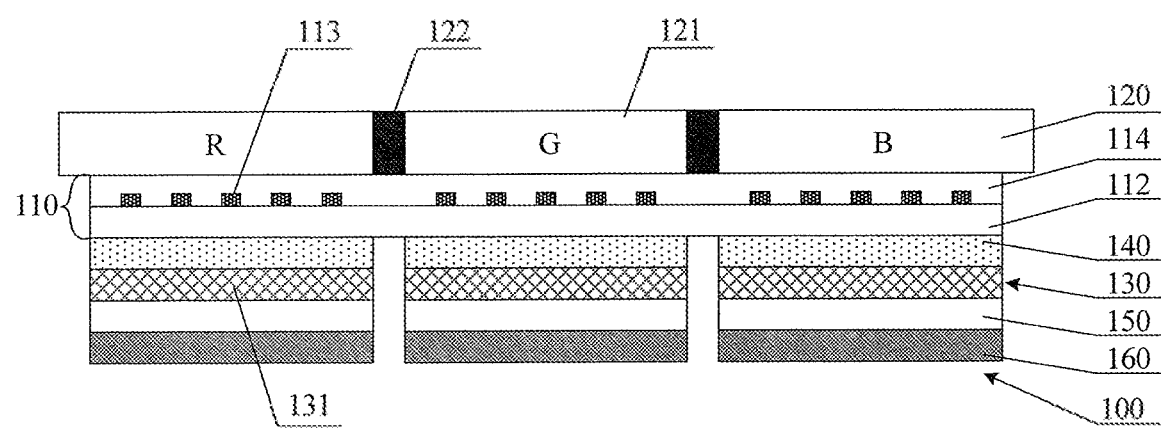
FIG. 10 shows a schematic diagram of a flexible display panel according to another embodiment of the present disclosure.

FIG. 10 shows a schematic diagram of a flexible display panel according to another embodiment of the present disclosure. The flexible display panel according to the present disclosure may be incorporated into an organic light-emitting diode (OLED) display device or an organic electroluminescent (OEL) display device). As shown in FIG. 10, the flexible display panel comprises a flexible substrate 160, a display layer 130, a lens layer 110, and a color filter layer 120. The flexible substrate 160, the lens layer 110, and the color filter layer 120 may be as described above.

The display layer 130 may comprise an anode layer, a light-emitting layer, and a cathode layer. The display layer 130 comprises a plurality of light-emitting units 131. The plurality of light-emitting units 131 may constitute the light-emitting layer. The lens layer 110 includes at least one lens that is provided between a light-emitting unit 131 and the filter unit 121 corresponding to the light-emitting unit 131. A light-emitting unit 131 comprises a plurality of light-emitting regions. The light-emitting regions of each light-emitting unit 131 is located within the focal length of the lens 111.

In some embodiments, the lens layer 110 may comprise a single lens 111. In some embodiments, the lens layer 110 may comprise a plurality of lenses 111. In embodiments where the lens layer 110 comprises a plurality of lenses 111, one light-emitting unit 131 may be provided within the focal length of each lens 111. Based on the correspondence between the light-emitting units 131 and the filter units 121 of the color filter layer 120, each lens 111 may be provided with a filter unit 121 on a light-emitting side of the lens 111. In some embodiments, the geometric center of the lens 111, the geometric center of light-emitting unit 131, and the geometric center of the filter unit 121 overlap. This way, the light-emitting region of the light-emitting unit 131 can be positioned as close as possible to the center of the focal length of the corresponding lens 111. This may in turn maximize the effect of the magnified light spot formed when light emitted by the light-emitting unit 131 passes through the corresponding lens 111.

Figure 11:
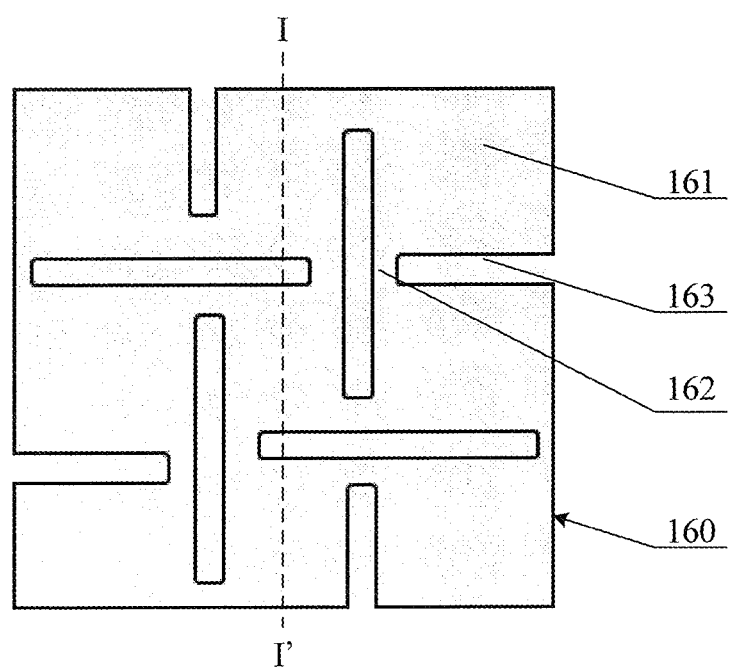
FIG. 11 shows a schematic diagram illustrating the openings on a flexible display panel, in a non-stretched state, according to an embodiment of the present disclosure.
Figure 12:
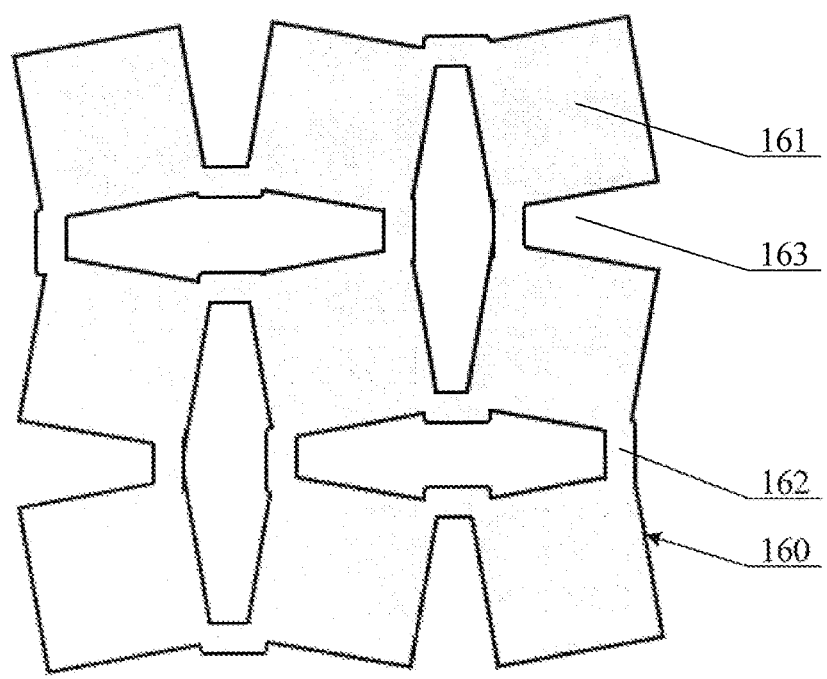
FIG. 12 shows a schematic diagram illustrating the openings on the flexible display panel in FIG. 1, in a stretched state.

In some embodiments, the flexible substrate 160 comprise a plurality of substrate regions 161, and a plurality of connecting portions 162 that connect adjacent substrate regions 161. In some embodiments, the connecting portions 162 are formed as grooves, gaps, slits, cuts, portions of reduced thickness, or the like that extend lengthwise and/or widthwise in the flexible substrate 160. The structures constituting the connecting portions 162 may be regularly shaped (for example, polygonal, waveform having repeating units of identical shape, and the like) or irregularly shaped (for example, with an undulating boundary, and the like). In some embodiments, the connecting portions 162 are formed only in the interior of the flexible substrate 160, that is, the connecting portions 162 do not extend to an edge of the flexible substrate 160, for example, as shown in FIGS. 11 and 12. In some embodiments, the connecting portions 162 are configured so that the plurality of substrate regions 161 are continuous. In some embodiments, the connecting portions may be formed, for example, as shown in WO2011/008459.

A plurality of slits 163 are formed between adjacent substrate regions 161, which help confer flexibility to the flexible substrate 160. In some embodiments, the slits 163 extend to an edge of the flexible substrate 160, for example, as shown in FIGS. 11 and 12. In some embodiments, the slits 163 may be regularly shaped (for example, polygonal, waveform having repeating units of identical shape, and the like) or irregularly shaped (for example, with an undulating boundary, and the like). The display layer 130 comprises a plurality of light-emitting units 131. The thin film transistor (TFT) array layer 150 comprises a plurality of TFTs. The plurality of light-emitting units 131 and the plurality of TFTs am arranged in the plurality of substrate regions 161. The plurality of light-emitting units 131 and the plurality of TFTs form islands on the flexible substrate 160, the islands being defined by the substrate regions 161. The light-emitting units 131 and the TFTs may not be provided in the connecting portions 162. The metal wiring that connects TFTs arranged in different substrate regions 161, in order to form the TFT array layer 150, may be provided in the connecting portions 162.

FIG. 11 shows a schematic diagram illustrating the openings on a flexible display panel, in a non-stretched state, according to an embodiment of the present disclosure. FIG. 12 shows a schematic diagram illustrating the openings on the flexible display panel in FIG. 11, in a stretched state. FIG. 10 is a cross-section of the flexible display panel in FIG. 11 along I-I'. As shown in FIGS. 1I and 12, when the flexible display panel is in the non-stretched state, the connecting portions 162 and the slits 163 between adjacent substrate regions 161 are of a regular shape. As shown in FIG. 12, when the flexible display panel is in the stretched state, the connecting portions 162 and the slits 163 become irregularly shaped, but the connecting portions 162 maintain the connections between the plurality of substrate regions 161, so that the flexible substrate 160 remains intact.

In the flexible display panel according to the present disclosure, the TFT array layer 150 may constitute the display driving back panel. Deformations in the TFT array layer 150 and the display layer 130 rely mainly on the slits 163 in the flexible substrate 160. The TFTs of the TFT array layer 150 are connected to each other via metal wiring. The metal wiring connecting the TFTs of the TFT army layer 150 is provided in the connecting portions 162.

In some embodiments, the lens layer 110, the color filter layer 120, and the display layer 130 are on the same side of the flexible substrate 160. In a top-emitting flexible display panel, the light-emitting side of the display layer 130 is on a side of the display layer 130 opposite from the flexible substrate 160, for example, as shown in FIGS. 1 and 9-10.

In addition, in a top-emitting flexible display panel, the lens layer 110 may be on a side of the encapsulation structure 140 opposite from the flexible substrate 160. The lens layer 110 and the color filter layer 150 are on the light-emitting side of the display layer 130.

In some embodiments, the lens layer 110 and the color filter layer 120 are on the same side of the flexible substrate 160. The display layer 130 is on a side of the flexible substrate 160 opposite from the lens layer 110 and the color filter layer 150. In a bottom-emitting flexible display panel, the light-emitting side of the display layer 130 is on a side of the display layer 130 closer to the flexible substrate 160, and the lens layer 110 and the color filter layer 150 are provided on the light-emitting side of the display layer 130, so that the lens layer 110 and the color filter layer 150 may be on a side of the flexible substrate 160 opposite from the display layer 130.

The lens layer 110 may comprise a plurality of lenses 111. The plurality of lenses may share a common lens substrate 112, for example, as shown in FIGS. 1 and 9-10. The lens substrate 112 may be adhered to the encapsulation structure 140 or the flexible substrate 160 via an adhesive. For example, the surface of the lens substrate 112 to be bonded to the encapsulation structure 140 or the flexible substrate 160 may be coated with an adhesive. In some embodiments, as shown in FIGS. 1 and 9, the flexible substrate 160 and the encapsulation structure 140 are each formed as a monolithic or unitary structure, and the lens substrate 112 of the lens layer 110 is provided directly on either the flexible substrate 160 or the encapsulation structure 140.

A Fresnel lens 111 may be provided on at least a portion of the plurality of the light-emitting units 131. In some embodiments, the Fresnel lens 111 covers a portion of the plurality of the light-emitting units 131. In some embodiments, the Fresnel lens 111 covers an entirety of the plurality of the light-emitting units 131. The light-emitting regions of the light-emitting units 131 are located within the focal length of the Fresnel lens 111.

When the flexible display panel 100 is stretched, the light-emitting units 131 located within the portion of the flexible display panel 100 that is stretched emit light that then passes through the Fresnel lens 111 to be projected as a magnified light spot on the color filter layer 120. Since the color filter layer 120 is also flexible, the structure and deformability of the color filter layer 120 allows the ratio of the "openings" corresponding to the ratio of the total area of the light-emitting regions to the total area of the non-light-emitting regions on the flexible display panel to be maintained. Even though light passing through the Fresnel lens 111 forms a magnified light spot on the color filter layer 120, the surface area of the filter unit 121 in those portions of the color filter layer 120 corresponding to stretched portions of the flexible display panel 100 is increased, and can capture substantially the entirety of the magnified light spot. Since the ratio of "openings" is maintained, the brightness of the display on the flexible display panel can also stay even and uniform. The present disclosure thus makes it possible to increase the total area of the light-emitting regions on the flexible display panel when stretched, so that stretching is less likely to reduce display brightness and/or the evenness of the display brightness.

The present disclosure also provides a display device comprising a flexible display panel as described above.

More particularly, the display device comprises a display region that comprises a flexible display panel as described above, and a non-display region that comprises a circuit, a camera, a camera flash, buttons, and the like. The non-display region frames the display region. It is understood that additional components and/or accessories may be provided within a display device of the present disclosure without departing from the spirit and scope of the present disclosure. A person of ordinary skill in the art would readily appreciate that the configuration of a display device is not limited to the embodiments shown in the figures, and a display device may include any additional components that are typically found in a display device and/or that are provided according to any particular purpose for which the display device is intended.

The present disclosure also provides a method of fabricating a flexible display panel as described above.

Figure 13:
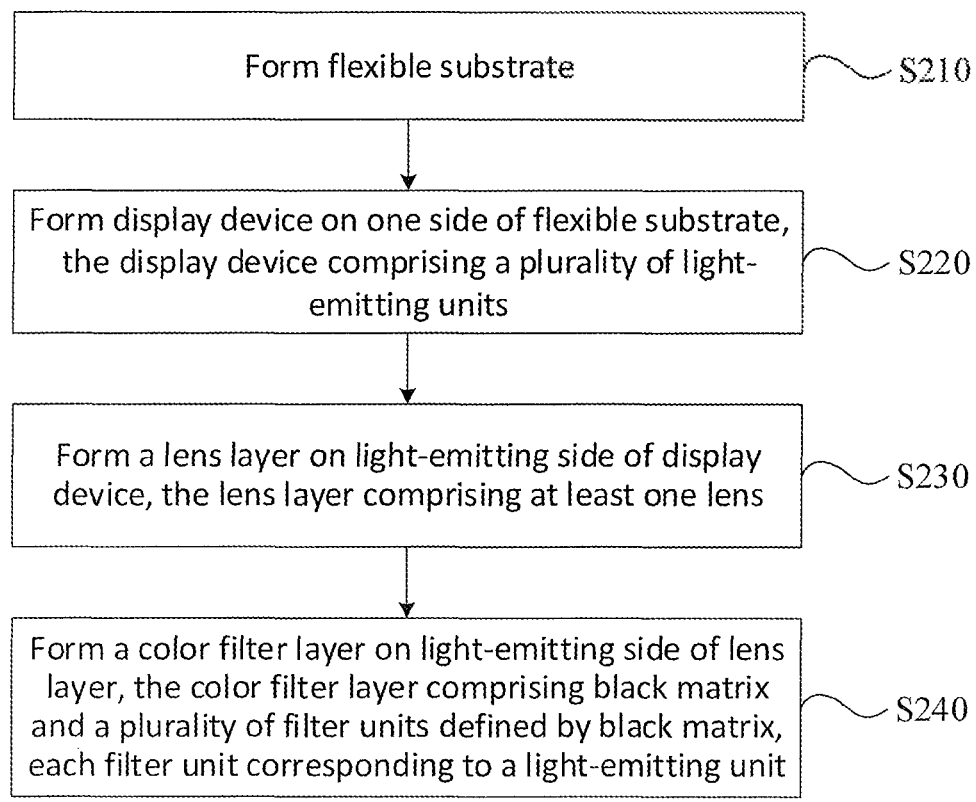
FIG. 13 shows a method of fabricating a flexible display panel according to an embodiment of the present disclosure.

FIG. 13 shows a method of fabricating a flexible display panel according to an embodiment of the present disclosure, for example, as shown in FIGS. 1 and 9-10.

As shown in FIG. 13, the method of fabricating a flexible display panel may comprise the following steps:

In step S210, the flexible substrate is formed.

To facilitate the fabrication process, the flexible display panel may be initially fabricated on a rigid base (for example, glass). For example, the flexible substrate may be formed on the rigid base, and the other components of the flexible display panel formed on the flexible substrate. The flexibility of the flexible display panel depends on the flexibility of the flexible substrate. In some embodiments, the flexible substrate may be formed by coating a polyimide solution on the rigid base, and curing the polyimide solution. The flexible substrate so formed is a polyimide layer. However, the composition of the flexible substrate and the method of forming the flexible substrate are not particularly limited. The flexible substrate may be formed by any appropriate means known to a person of ordinary skill in the art, so long as the substrate is formed with flexibility.

In step S220, the display layer is formed on one side of the flexible substrate. The display layer comprises a plurality of light-emitting units.

In step S230, the lens layer is formed on the light-emitting side of the display layer. The lens layer comprises at least one lens. The lens may be a convex lens. The plane of the lens is closer to the light-emitting side of the display layer, and the convex portion of the lens is convex in the direction in which the light is emitted. In some embodiments, the lens is a Fresnel lens.

In step S240, the color filter layer is formed on the light-emitting side of the lens layer. The color filter layer comprises a black matrix, and a plurality of filter units defined by the black matrix. Each filter unit corresponds to a light-emitting unit. A lens of the lens layer corresponds to at least one filter unit.

The at least one lens is configured so that light emitted by the corresponding light-emitting unit passes through the lens and forms a magnified light spot on the surface of the color filter layer facing the light-emitting unit. The area of the magnified light spot is larger than the surface area of the filter unit in the non-stretched state. The surface area of the color filter unit increases when the filter unit is in a stretched state.

The display layer comprising the plurality of light-emitting units may constitute the light-emitting structure of the flexible display panel. In some embodiments where the flexible display panel according to the present disclosure is incorporated into an organic light-emitting diode (OLED) display device, the display layer may comprise an anode layer, a light-emitting layer, and a cathode. The plurality of light-emitting units may constitute the light-emitting layer.

As shown in FIGS. 1 and 9-10, an encapsulation structure may be formed between the lens layer 110 and the display layer 130. The encapsulation structure is a structure for packaging components inside the flexible display panel. The lens layer comprises at least one lens, which may be a convex lens or a Fresnel lens. The plane of the lens is closer to the light-emitting side of the display layer. As shown in FIGS. 1a and 9-10, in a top-emitting flexible display panel, the lens layer may be provided on a side of the encapsulation structure opposite from the flexible substrate. On the other hand, in a bottom-emitting flexible display panel, the lens layer may be provided on a side of the flexible substrate opposite from the display layer. The convex portion of the lens is convex in the direction in which the light is emitted. Light emitted by the light-emitting units in the display layer passes through the lens and forms a magnified light spot on the surface of the color filter layer closer to the display layer.

When the lens is a convex lens, based on the principles of optics, an image of an object is magnified when the distance between the object and the convex lens is smaller than the focal length. The light-emitting units are positioned within the focal length of the corresponding lens, and more particularly, the light-emitting regions of the light-emitting units are located within the focal length of the lens. When the light-emitting units and the lens are so configured, light emitted by the light-emitting units passes through the lens, and according to the principles of optics, forms a magnified light spot on the color filter layer facing the light-emitting unit.

When the filter unit is in a non-stretched state, the surface area of the filter unit, as defined by the black matrix, is smaller than the area of the light spot formed by the light passing through the lens. As a result, from the perspective of the light-emitting unit provided with the lens on its light-emitting side, the black matrix in a flexible display panel in the non-stretched state blocks a portion of the light emitted by the light-emitting unit. The lens has a focal length f. The light-emitting region of the light-emitting unit is located entirely within the focal length f of the lens. Light emitted by the light-emitting unit passes through the lens and becomes diffused. However, portions of the light projected onto the filter unit are blocked by the black matrix. In other words, the light spot formed by the light emitted by the light-emitting units and that passes through the lens has an area that is larger than the surface area of the filter unit in the non-stretched state.

When the flexible display panel is in a stretched state, the surface area of the filter units as defined by the black matrix is increased. The surface area of a filter unit increases when the filter unit is in a stretched state. The filter unit is configured so that its surface area may increase when the filter unit is in a stretched state, but the surface area of the filter unit is not necessarily increased whenever the filter unit is stretched. Rather, the filter unit must be stretched past a certain threshold before the surface area of the filter unit is affected.

On the other hand, when the flexible display panel is in the stretched state, the surface area of the filter unit defined by the black matrix increases, so that light initially blocked by the black matrix when the flexible display panel was in the non-stretched state is now projected onto the filter unit with the increased surface area. In other words, the light-emitting surface of the flexible display panel is effectively increased. The light spot formed by light emitted by the light-emitting unit and that passes through the lens has an area that is larger than the surface area of the filter unit in the non-stretched state. The surface area of the filter unit in the non-stretched state refers to the surface area of the filter unit when the filter unit has not undergone any deformations.

The number and position of the lens are not particularly limited. For example, in some embodiments, the flexible display panel may comprise a single lens, and the single lens is located at a position on the flexible display panel most likely to be subject to stretching. In some embodiments, the flexible display panel may comprise a plurality of lenses. The flexible display panel may comprise the same number of light-emitting units and lenses, or the flexible display panel may comprise fewer lenses than the light-emitting units. The lenses may be located at positions on the flexible display panel most likely to be subject to stretching. The lenses may be arranged in a distributed manner, or in a centralized manner.

The light-emitting units may be configured to emit white light. Light emitted by the light-emitting units remains a white light after passing through the lens. The color filter layer on the light-emitting side of the lens layer converts the white light into colored lights. The color filter layer 120 comprises a plurality of filter units. The filter units may comprise a red filter unit (R), a green filter unit (G), and a blue filter unit (B). When white light passes through the filter units of the color filter layer, the white light becomes a red, green, or blue monochromatic light, and realizes the display functions of the flexible display panel. To avoid color washout due to interference from adjacent filter units of different colors, a black matrix is provided with adjacent filter units to separate the adjacent filter units, for example.

The color filter layer in the flexible display panel according to the present disclosure may be fabricated as follows:

In step 1, a light-shielding layer is formed on the lens layer. The light-shielding layer may be composed of a (meth)acrylate material.

In step 2, the light-shielding layer is patterned to form the black matrix. The black matrix may therefore be composed a (meth)acrylate material.

In step 3, filter units are formed on the lens layer between the black matrix. The filter units may comprise a red filter unit (R), a green filter unit (G), and a blue filter unit (B).

The above steps produce a color filter layer on the lens layer. An organic polymer layer may be formed on the color filter layer. The organic polymer layer functions to protect the color filter layer.

The method of fabricating the flexible display panel may further comprise a step of removing the rigid base, so as to obtain the flexible display panel.

As described above, to facilitate the fabrication process, the flexible display panel may be initially fabricated on a rigid base. For example, the flexible substrate may be formed on the rigid base, and the other components of the flexible display panel formed on the flexible substrate. After the flexible display panel has been formed, the rigid base needs to be removed, so as to restore the flexibility to the flexible display panel.

There is a degree of randomness in the stretching of a flexible display panel, so that it may be difficult to determine how the flexible display panel is deformed when stretched, and the flexible display panel may not be uniformly stretched. As a result, a situation may arise where stretching reduces the ratio of "openings" corresponding to the ratio of the total area of the light-emitting regions to the total area of the non-light-emitting regions in some portions of the flexible display panel that are stretched, while the ratio remains the same in other portions of the flexible display panel that are not stretched. Not only can this cause a noticeable drop in the display brightness in those portions of the flexible display panel that are stretched, but because there are also portions of the flexible display panel that are unaffected by stretching, the display brightness becomes uneven across the flexible display panel.

In the flexible display panel according to the present disclosure, portions of the color filter layer deform according to the corresponding portions of the flexible display panel that are stretched. Portions of the color filter layer that correspond to portions of the flexible display panel that are not stretched remain substantially unchanged. In portions of the color filter layer corresponding to stretched portions of the flexible display panel, the surface area of the filter unit as defined by the black matrix increases. Light emitted by the light-emitting unit passes through the lens and forms a magnified light spot on the surface of the color filter layer facing the light-emitting unit. Since the surface area of the filter unit has increased, the total area of light-emitting area on the flexible display panel also increases. The structure and deformability of the color filter layer allows the ratio of the "openings" to be maintained, because even though light passing through the lens forms a magnified light spot on the color filter layer, only the surface area of the filter unit in those portions of the color filter layer corresponding to stretched portions of the flexible display panel is increased. Since the ratio of "openings" corresponding to the ratio of the total area of the light-emitting regions to the total area of the non-light-emitting regions is maintained, the brightness of the display on the flexible display panel can also stay even and uniform.

The color filter layer in the flexible display panel according to the present disclosure includes a black matrix and a plurality of filter units. Each filter unit corresponds to a light-emitting unit, and is defined by the black matrix. The surface area of a color filter unit increases when the filter unit is in a stretched state. The lens layer includes at least one lens provided between a light-emitting unit and the corresponding filter unit. The at least one lens is configured so that light emitted by the light-emitting unit, and that passes through the lens, forms a magnified light spot on the surface of the color filter layer facing the light-emitting unit. The area of the magnified light spot is larger than the surface area of the filter unit in a non-stretched state. The present disclosure makes it possible to increase the total area of the light-emitting regions on the flexible display panel when stretched, so that stretching is less likely to reduce display brightness and/or the evenness of the display brightness.

Figure 14:
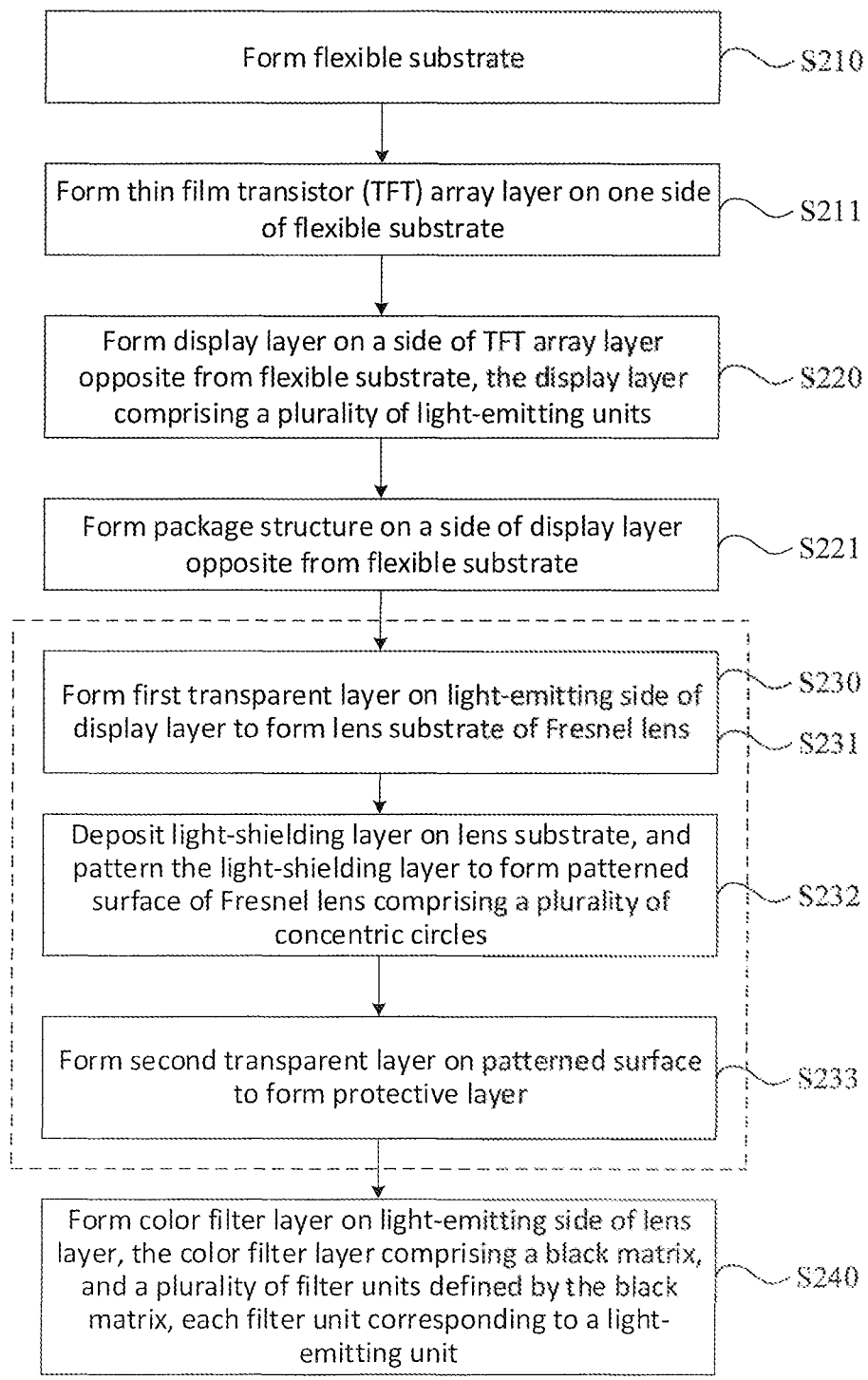
FIG. 14 shows a method of fabricating a flexible display panel according to another embodiment of the present disclosure.

FIG. 14 shows a method of fabricating a flexible display panel according to another embodiment of the present disclosure.

In the flexible display panel according to the present disclosure, the lens layer comprises at least one lens. The lens may be a convex lens. The plane of the lens is closer to the light-emitting side of the display layer, and the convex portion of the lens is convex in the direction in which the light is emitted. In some embodiments, the lens is a Fresnel lens. In those embodiments where the lens is a Fresnel lens, step S230 may further comprise the following:

In step S231, a first transparent polymer layer is deposited on the light-emitting side of the display layer, so as to form the lens substrate of the Fresnel lens. The first transparent polymer layer may comprise a PDMS layer, and may be formed by bonding the PDMS layer to the surface of the display layer via an adhesive. PDMS is known to be a transparent elastic polymer, and as such, PDMS is suitable for forming a lens with light transmissivity and flexibility.

In step S232, a light-shielding layer is deposited on the lens substrate. The light-shielding layer is patterned to form the patterned surface of the Fresnel lens. The patterned surface comprises a plurality of concentric circles formed by a plurality of concentric ridges. The light-shielding layer may be composed of CNT.

The first transparent polymer layer forms the lens substrate of the Fresnel lens, and the light-shielding layer forms the patterned surface of the Fresnel lens having the pattern of concentric circles. After the light-shielding layer is deposited, the light-shielding layer is flat because the lens substrate is flat. The light-shielding layer therefore needs to be masked in a patterning process, for example, through adhesive coating, exposure, development, and etching, in order to form the patterned surface. The contours on the patterned surface f the Fresnel lens act as individual refracting surfaces, bending parallel rays of incident light on the Fresnel lens to a common focal point. Conversely, the contours on the patterned surface of the Fresnel lens also allow it to easily collimate a point light source, by placing the Fresnel lens one focal length away from the source.

Step S230 may further comprise the following:

In step S233, a second transparent polymer layer is deposited on the patterned surface of the Fresnel lens, in order to form the protective layer. The second transparent polymer layer may also comprise a PDMS layer. The second transparent polymer layer may be formed in a similar manner as the first transparent polymer layer.

As described above, the lens layer comprises at least one lens. The lens may be a convex lens. The plane of the lens is closer to the light-emitting side of the display layer, and the convex portion of the lens is convex in the direction in which the light is emitted. In some embodiments, the lens is a Fresnel lens. The focal length of a Fresnel lens is determined according to the following equation (1):

$$f = \frac{r_n^2}{n\lambda}; \qquad (1)$$

In equation (1) "f" represents the focal point of each concentric circle. The variable "r" represents the radius of the $n^{th}$ concentric circle. The variable "λ" represents the light wavelength of concern. Based on equation (1), the radius of each concentric circle of the Fresnel lens may be calculated for a given focal length.

In the method of fabricating a flexible display panel according to the present disclosure, before step S220, the TFT array layer may be formed on one side of the flexible substrate (step S211).

More particularly, step S220 may comprise forming the display layer on aside of the TFT array layer opposite from the flexible substrate.

Before step S230, the encapsulation structure may be formed on a side of the display layer opposite from the flexible substrate (step S221).

The method of fabricating a flexible display panel according to the present disclosure may comprise forming the flexible substrate and the TFT array layer according to the following steps:

In step 1, the flexible substrate is formed on the rigid base. In some embodiments, the flexible substrate may be formed by coating a polyimide solution on the rigid base, and curing the polyimide solution. The flexible substrate so formed is a polyimide layer. However, the composition of the flexible substrate and the method of forming the flexible substrate are not particularly limited. The flexible substrate may be formed by any appropriate means known to a person of ordinary skill in the art, so long as the substrate is formed with flexibility.

In step 2, the flexible substrate is patterned to form a plurality of substrate regions and connecting portions, for example, as shown in FIGS. 11 and 12. The connecting portions connect adjacent substrate regions. The flexible substrate may be patterned, for example, through adhesive coating, exposure, development, and etching, to form the patterned surface, to form grooves, gaps, slits, cuts, portions of reduced thickness, or the like through the flexible substrate and the substrate regions in the flexible substrate. The plurality of substrate regions form islands on the rigid base. As a result, the plurality of light-emitting units and the plurality of TFTs that are subsequently formed on the flexible substrate also form islands on the flexible substrate, the islands being defined by the substrate regions.

In step 3, an inorganic layered structure is formed on at least a portion of the plurality of substrate regions, in order to form the TFT array layer. The inorganic layered structure comprises the component layers of a TFT. The TFT of the TFT array layer may have any design and construction known to a person of ordinary skill in the art. The inorganic layered structure may be formed by, for example, forming a component film by chemical vapor deposition or physical vapor deposition, and then patterning the component film by adhesive coating, exposure, development, and etching to obtain the desired pattern for that particular component film.

In step 4, a metal layer is deposited and then patterned to form the metal wiring connecting the plurality of TFTs in the TFT array layer. The metal wiring is formed in the connecting portions that connect adjacent substrate regions of the flexible substrate.

In another embodiment of the method of fabricating a flexible display panel according to the present disclosure, the flexible substrate and the TFT array layer may be formed according to the following steps:

In step 1, the flexible substrate is formed on the rigid base, for example, in the manner described above.

In step 2, an inorganic layered structure is formed on the flexible substrate to form the TFT array layer, for example, in the manner described above.

In step 3, a metal layer is deposited and then patterned to form the metal wiring connecting the plurality of TFTs of the TFT array layer, for example, in the manner described above.

In step 4, the flexible substrate is patterned to form a plurality of substrate regions and connecting portions. The connecting portions connect adjacent substrate regions. The metal wiring connecting the TFTs of the TFT array layer is formed in the connecting portions.

In other words, the TFT array layer is formed on the flexible substrate (for example, a polyimide film) before the flexible substrate is patterned to form the plurality of substrate regions. The TFTs of the TFT array layer, and the metal wiring connecting the TFTs, must be protected by any known appropriate means during patterning to avoid damages.

The metal wiring connecting the TFTs of the TFT array layer is formed by a process of depositing a metal layer followed by patterning. The functions of the connecting portions between the substrate regions include, on the one hand, defining the portions of the flexible substrate for forming the metal wiring connecting the TFTs of the TFT array layer, and on the other hand, maintaining the connections between the plurality of substrate regions 161 when the flexible display panel is stretched, so that the flexible substrate 160 remains intact. It should be noted that if the flexible display panel is to be incorporated into an OLED display device, the deposited metal layer further includes the anode layer of the light-emitting layer. Evaporation is then performed to form the light-emitting unit. A layer-by-layer deposition of thin film encapsulation (TFE) on the light-emitting layer is then performed to form the encapsulation structure.

In the description of the specification, references made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should covered other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures am set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:
1. A flexible display panel, comprising:
a flexible substrate;
a display layer on the flexible substrate; and
a lens layer and a color filter on the display layer;
wherein:
the display layer comprises a plurality of light-emitting units,
the color filter layer comprises a black matrix that defines a plurality of filter units, each filter unit corresponding to one of the plurality of light-emitting units,
the lens layer and the color filter are on a light-emitting side of the display layer,
the lens layer comprising at least one lens, the at least one lens corresponding to at least one of the plurality of filter units, and the at least one lens is configured to magnify light emitted by a light-emitting unit into a magnified light spot, and project the magnified light spot onto a filter unit corresponding to the light-emitting unit, the magnified light spot having an area larger than a surface area of the corresponding filter unit in a non-stretched state, wherein an entirety of a light-emitting region of each of the plurality of light-emitting units is located within a focal length of the at least one lens.

2. The flexible display panel according to claim 1, wherein the light-emitting side of the display layer is on a side of the display layer opposite from the flexible substrate, and the lens layer is between the display layer and the color filter layer.

3. The flexible display panel according to claim 1, wherein the light-emitting side of the display layer is on a side of the display layer closer to the flexible substrate, and the lens layer and the color filter layer are on a side of the flexible substrate opposite from the display player.

4. The flexible display panel according to claim 1, wherein the at least one lens is a convex lens.

5. The flexible display panel according to claim 1, wherein the at least one lens is a Fresnel lens.

6. The flexible display panel according to claim 4, wherein a plane of the at least one lens is on a side of the lens layer closer to the display layer, and a convex portion of the at least one lens is convex along a direction in which the light is emitted.

7. The flexible display panel according to claim 1, wherein an entirety of each of the plurality of light-emitting units is located within a focal length of the at least one lens.

8. The flexible display panel according to claim 1, wherein the flexible substrate comprises a plurality of substrate regions and a plurality of connecting portions connecting adjacent substrate regions.

9. The flexible display panel according to claim 8, wherein the plurality of light-emitting units form islands on the plurality of substrate regions.

10. The flexible display panel according to claim 8, wherein the plurality of connecting portions are deformable.

11. The flexible display panel according to claim 1, wherein the flexible display panel comprises a plurality of light-emitting regions and a plurality of non-light-emitting regions, and a ratio of a total area of the plurality of light-emitting regions to a total area of the plurality of non-light-emitting regions remains substantially the same when the flexible display panel is in a stretched state or in the non-stretched state.

12. The flexible display panel according to claim 1, further comprising a thin film transistor array layer between the display layer and the flexible substrate.

13. The flexible display panel according to claim 1, further comprising an encapsulation structure on the light-emitting side of the display layer.

14. A display device comprising the flexible display panel according to claim 1.

15. A method of fabricating the flexible display panel according to claim 1, the method comprising:
forming the flexible substrate;
forming the display layer on one side of the flexible substrate;
forming the lens layer on the light-emitting side of the display layer; and
forming the color filter layer on a light-emitting side of the lens layer.

16. The method according to claim 15, further comprising, before the forming of the display layer, forming a thin film transistor array layer on the flexible substrate, and
wherein the display layer is formed on a side of the thin film transistor array layer opposite from the flexible substrate.

17. The method according to claim 16, further comprising forming an encapsulation structure on the thin film transistor array layer.

18. The method according to claim 16, wherein the lens layer comprises at least one Fresnel lens, and wherein the forming of the lens layer comprises:
forming a first transparent layer on the light-emitting side of the display layer to form a lens substrate;
forming a light-shielding layer on the lens substrate, and patterning the light-shielding layer to form a patterned surface comprising a plurality of concentric circles, the lens substrate and the patterned surface forming the Fresnel lens.

19. The method according to claim 18, wherein the forming of the lens layer further comprises forming a second transparent layer on the patterned surface to form a protective layer.

* * * * *